US012563906B2

(12) United States Patent
Wang

(10) Patent No.: US 12,563,906 B2
(45) Date of Patent: Feb. 24, 2026

(54) ARRAY SUBSTRATE AND DISPLAY APPARATUS

(71) Applicant: BOE Technology Group Co., Ltd., Beijing (CN)

(72) Inventor: Yingtao Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 469 days.

(21) Appl. No.: 18/004,896

(22) PCT Filed: Jan. 25, 2022

(86) PCT No.: PCT/CN2022/073611
§ 371 (c)(1),
(2) Date: Jan. 10, 2023

(87) PCT Pub. No.: WO2023/141737
PCT Pub. Date: Aug. 3, 2023

(65) Prior Publication Data
US 2024/0251601 A1 Jul. 25, 2024

(51) Int. Cl.
*H10K 59/122* (2023.01)

(52) U.S. Cl.
CPC ................................... *H10K 59/122* (2023.02)

(58) Field of Classification Search
None
See application file for complete search history.

(56) References Cited

U.S. PATENT DOCUMENTS

| | | | |
|---|---|---|---|
| 2006/0194500 A1* | 8/2006 | Ishii | G02F 1/136227 |
| | | | 445/24 |
| 2013/0242220 A1* | 9/2013 | Chang | G02F 1/1368 |
| | | | 257/43 |
| 2015/0325634 A1* | 11/2015 | Chao | G02F 1/136227 |
| | | | 257/40 |
| 2019/0252478 A1 | 8/2019 | Son et al. | |
| 2020/0203384 A1 | 6/2020 | Huo | |
| 2021/0202664 A1 | 7/2021 | Kim | |
| 2021/0234125 A1 | 7/2021 | Sung et al. | |
| 2021/0335939 A1* | 10/2021 | Li | H10K 59/878 |

FOREIGN PATENT DOCUMENTS

| | | |
|---|---|---|
| CN | 109686768 A | 4/2019 |
| CN | 110164918 A | 8/2019 |
| CN | 112262477 A | 1/2021 |
| CN | 112635537 A | 4/2021 |

(Continued)

OTHER PUBLICATIONS

International Search Report & Written Opinion mailed Oct. 10, 2022, regarding PCT/CN2022/073611.

*Primary Examiner* — Bilkis Jahan
(74) *Attorney, Agent, or Firm* — Intellectual Valley Law, P.C.

(57) ABSTRACT
An array substrate is provided. The array substrate includes a pixel definition layer defining a plurality of subpixel regions. The pixel definition layer includes an undercut structure. The undercut structure includes a first insulating layer on a base substrate; and a second insulating layer on a side of the first insulating layer away from the base substrate. The first insulating layer is undercut relative to the second insulating layer.

19 Claims, 14 Drawing Sheets

(56)  References Cited

FOREIGN PATENT DOCUMENTS

| CN | 212967707 U | 4/2021 |
| CN | 112802940 A | 5/2021 |
| CN | 112864344 A | 5/2021 |
| CN | 113053961 A | 6/2021 |
| CN | 113097412 A | 7/2021 |

* cited by examiner

| CDL |
| --- |
| EIL |
| ETL2 |
| HBL |
| EML3 |
| HTL3 |
| HTL2 |
| HIL2 |
| CGL |
| ETL1 |
| EML2 |
| EML1 |
| HTL1 |
| HIL1 |
| AD |

FIG. 13

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/073611, filed Jan. 25, 2022, the contents of which are incorporated by reference in the entirety.

TECHNICAL FIELD

The present invention relates to display technology, more particularly, to an array substrate and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present disclosure provides an array substrate, comprising a pixel definition layer defining a plurality of subpixel regions; wherein the pixel definition layer comprises an undercut structure, the undercut structure comprising a first insulating layer on a base substrate; and a second insulating layer on a side of the first insulating layer away from the base substrate; and the first insulating layer is undercut relative to the second insulating layer.

Optionally, an orthographic projection of the second insulating layer on the base substrate covers an orthographic projection of the first insulating layer on the base substrate.

Optionally, a first maximum width of the first insulating layer along a direction across two adjacent subpixel is smaller than a second maximum width of the second insulating layer along the direction across two adjacent subpixel regions.

Optionally, the array substrate further comprises a first groove extending in an inter-subpixel region, configured to receive at least a portion of the second insulating layer; wherein lateral walls and a bottom of the first groove are formed by a surface of the first insulating layer.

Optionally, the pixel definition layer comprises a plurality of first ring structures respectively in a plurality of first ring regions of an inter-subpixel region; and the plurality of first ring structures are formed by a plurality of protrusions of the undercut structure.

Optionally, the array substrate comprises a second groove extending in the inter-subpixel region; and wherein lateral walls and a bottom of the second groove are formed by a surface of the second insulating layer.

Optionally, a respective protrusion of the plurality of protrusions protrudes away from the bottom of the second groove.

Optionally, the plurality of first ring structures are spaced apart from each other; and a respective first ring region of the plurality of first ring regions surrounds a respective subpixel region of the plurality of subpixel regions.

Optionally, at least a portion of the pixel definition layer comprises a stacked structure; and the stacked structure comprises a third insulating layer, the first insulating layer on the third insulating layer, the second insulating layer on a side of the first insulating layer away from the third insulating layer.

Optionally, the array substrate further comprises an organic layer; wherein the stacked structure further comprises a portion of the organic layer on a side of the second insulating layer away from the first insulating layer.

Optionally, the third insulating layer comprises a first insulating portion and a second insulating portion separated from each other; the first insulating portion is in contact with an inter-layer dielectric layer; and the second insulating portion is on edges of respective anodes of a plurality of anodes, insulating the respective anodes from an organic layer.

Optionally, a width of the stacked structure along a direction across two adjacent subpixel regions is in a range of 0.5 μm to 1.5 μm.

Optionally, the array substrate further comprises a third insulating layer comprising a first insulating portion and a second insulating portion separated from each other; wherein the third insulating layer comprises a plurality of second ring structures respectively in a plurality of second ring regions of an inter-subpixel region; and the plurality of second ring structures are formed by the second insulating portion.

Optionally, the plurality of second ring structures are spaced apart from each other; and a respective second ring region of the plurality of second ring regions surrounds a respective subpixel region of the plurality of subpixel regions.

Optionally, the array substrate further comprises an organic layer, the organic layer comprising a first functional layer extending across the plurality of subpixel regions and an inter-subpixel region; the first functional layer comprises a first part at least partially in a first adjacent subpixel region of the plurality of subpixel regions, a second part in the inter-subpixel region, and a third part at least partially in a second adjacent subpixel region of the plurality of subpixel regions; and the first part, the second part, and the third part are at least partially discontinuous parts at least partially segregated due to presence of the undercut structure.

Optionally, the first functional layer is a charge generating layer.

Optionally, the array substrate further comprises a cathode layer; wherein the cathode layer comprises a plurality of third ring structures respectively in a plurality of third ring regions of an inter-subpixel region.

Optionally, a respective third ring structure of the plurality of third ring structures protrudes away from the base substrate, forming a ridge; and the ridge formed by the respective third ring structure substantially surrounds a respective subpixel region of the plurality of subpixel regions.

Optionally, the cathode layer is a unitary layer and further comprises a plurality of first cathode portions in the plurality of subpixel regions, respectively; and the cathode layer rises above a respective first cathode portion of the plurality of first cathode portions when it transitions into a respective third ring structure.

In another aspect, the present disclosure provides a display apparatus, comprising the array substrate described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 13 is a schematic diagram illustrating the structure of an organic layer in an array substrate in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a pixel definition layer defining a plurality of subpixel regions. Optionally, the pixel definition layer includes an undercut structure. Optionally, the undercut structure includes a first insulating layer on a base substrate; and a second insulating layer on a side of the first insulating layer away from the base substrate. Optionally, the first insulating layer is undercut relative to the second insulating layer.

Figure 1:
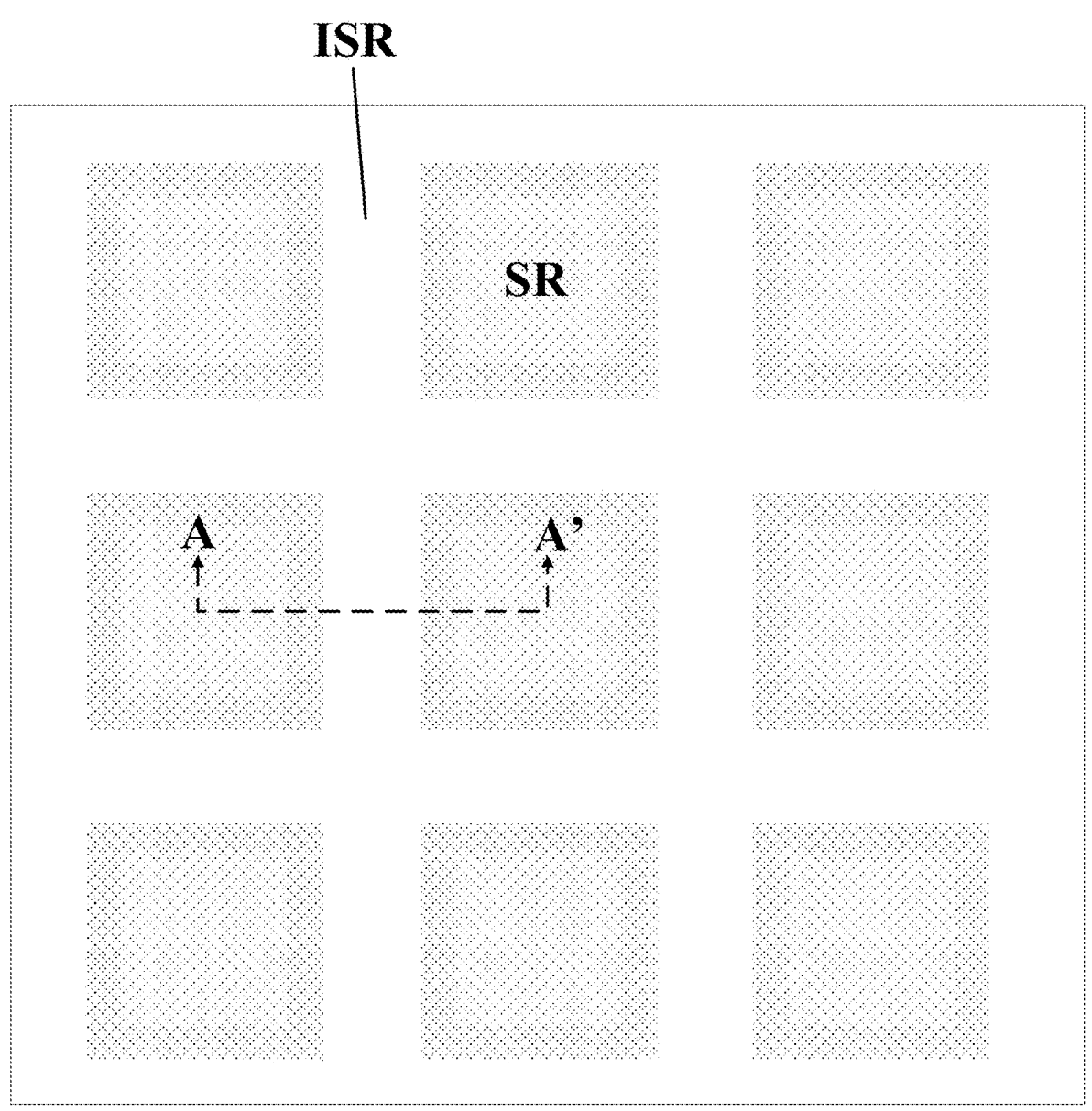
FIG. 1 is a plan view of an array substrate in some embodiments according to the present disclosure.

FIG. 1 is a plan view of an array substrate in some embodiments according to the present disclosure. Referring to FIG. 1, the array substrate in some embodiments includes a plurality of subpixel regions SR and an inter-subpixel region ISR. The inter-subpixel region ISR surrounds each of the plurality of subpixel regions SR. Optionally, the inter-subpixel region ISR is a unitary region. The plurality of subpixel regions SR are spaced apart from each other by the inter-subpixel region ISR.

As used herein, a subpixel region refers to a light emission region of a subpixel, such as a region corresponding to a pixel electrode in a liquid crystal display, or a region corresponding to a light emissive layer in a light emitting diode display panel, or a region surrounding by the pixel definition layer according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in a light emitting diode display panel, or a region corresponding to a pixel definition layer in combination with an undercut structure according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 2:
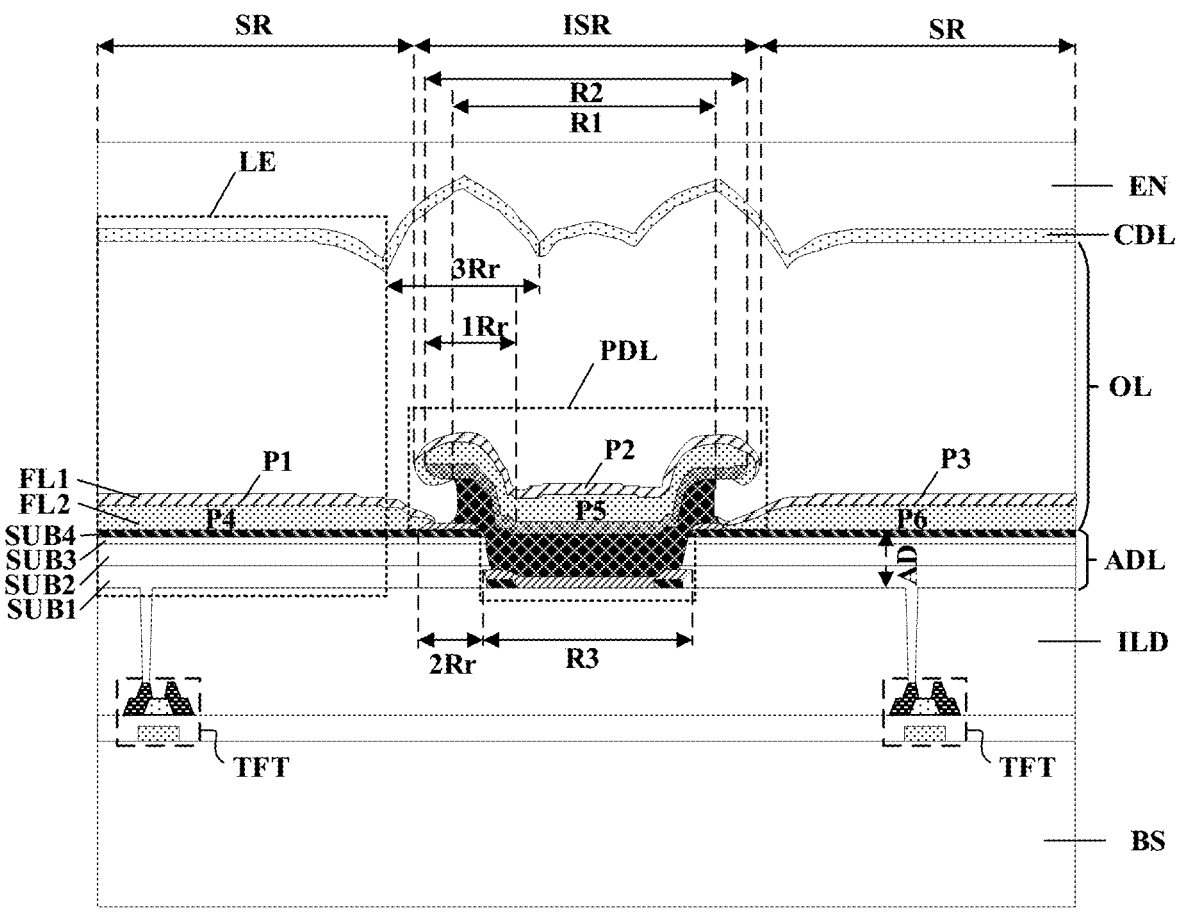
FIG. 2 is a cross-sectional view along an A-A' line in FIG. 1.

FIG. 2 is a cross-sectional view along an A-A' line in FIG. 1. Referring to FIG. 2, the array substrate in some embodiments includes a plurality of light emitting elements LE, e.g., a plurality of organic light emitting elements. In some embodiments, the array substrate includes an anode layer ADL and a cathode layer CDL. Optionally, the anode layer ADL includes a plurality of anodes AD for the plurality of light emitting elements LE, respectively. A respective light emitting element includes a respective anode of the plurality of anodes AD, an organic layer OL, and a cathode (e.g., the cathode layer CDL). The array substrate further includes a plurality of transistors. A respective transistor is connected to the anode AD in the respective light emitting element. Optionally, the cathode layer CDL is a unitary cathode layer extending across the plurality of subpixel regions SR and the inter-subpixel region ISR. Optionally, the organic layer OL includes a light emitting layer, e.g., an organic light emitting layer. Optionally, the organic layer OL further includes one or more functional layers such as an electron transport layer, an electron injection layer, an electron barrier layer, a hole transport layer, a hole injection layer, a hole barrier layer, and a charge generating layer. Optionally, at least one layer of the organic layer OL is a layer extending across the plurality of subpixel regions SR and the inter-subpixel region ISR. In one example, the organic layer OL includes a first functional layer FL1 (e.g., a charge generating layer), which is a layer extending across the plurality of subpixel regions SR and the inter-subpixel region ISR.

In some embodiments, the array substrate is a complementary metal oxide semiconductor (COMS) array substrate. In one example, a complementary metal oxide semiconductor includes a positive channel metal oxide semiconductor (PMOS) and a negative channel metal oxide semiconductor (NMOS). In another example, the array substrate includes a silicon CMOS chip; and a via hole layer disposed on the silicon CMOS chip and having a via hole, wherein the silicon CMOS chip is connected to the plurality of pixel electrodes through the via hole of the via hole layer.

In some embodiments, the array substrate includes an encapsulating layer EN that encapsulates the plurality of light emitting elements LE. The encapsulating layer EN may include multiple sublayers. In one example, the encapsulating layer EN includes a first inorganic encapsulating sublayer on the cathode layer CDL, an organic encapsulating sublayer on a side of the first inorganic encapsulating sublayer away from the cathode layer CDL, and a second inorganic encapsulating sublayer on a side of the organic encapsulating sublayer away from the first inorganic encapsulating sublayer.

In some embodiments, the plurality of anodes AD may include multiple sublayers. In one example, the plurality of anodes AD include a first sublayer SUB1 made of a metallic material (e.g., titanium) on an inter-layer dielectric layer ILD, a second sublayer SUB2 made of a metallic material (e.g., aluminum) on a side of the first sublayer SUB1 away from the inter-layer dielectric layer ILD, a third sublayer SUB3 made of a metallic material (e.g., titanium) on a side of the second sublayer SUB2 away from the first sublayer SUB1, and a fourth sublayer SUB4 made of a metal oxide material (e.g., indium tin oxide) on a side of the third sublayer SUB3 away from the second sublayer SUB2.

Figure 3:
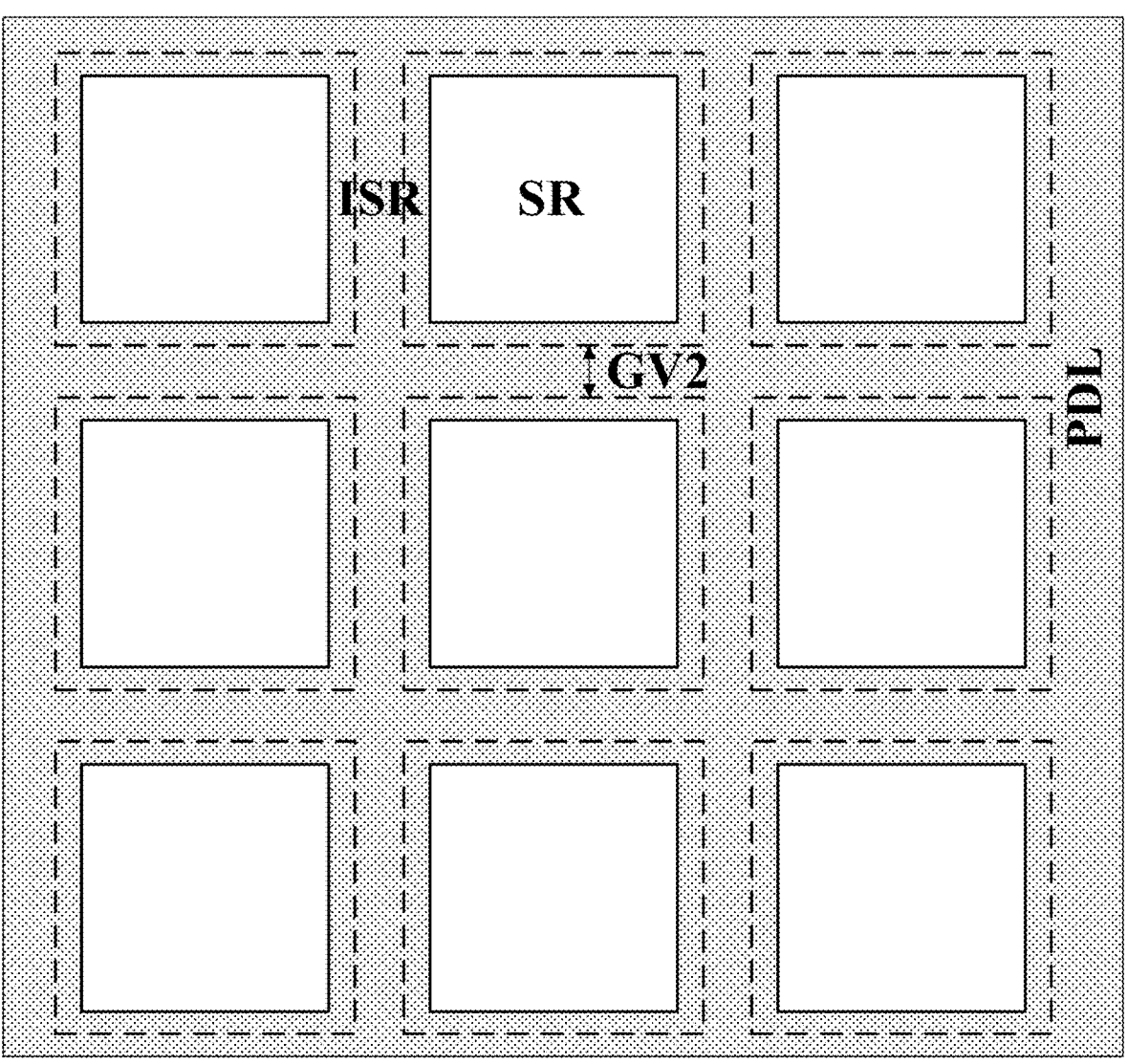
FIG. 3 is a plan view of a pixel definition layer in an array substrate in some embodiments according to the present disclosure.

FIG. 3 is a plan view of a pixel definition layer in an array substrate in some embodiments according to the present disclosure. Referring to FIG. 2 and FIG. 3, the array substrate in some embodiments further includes a pixel definition layer PDL defining the plurality of subpixel regions.

Figure 4:
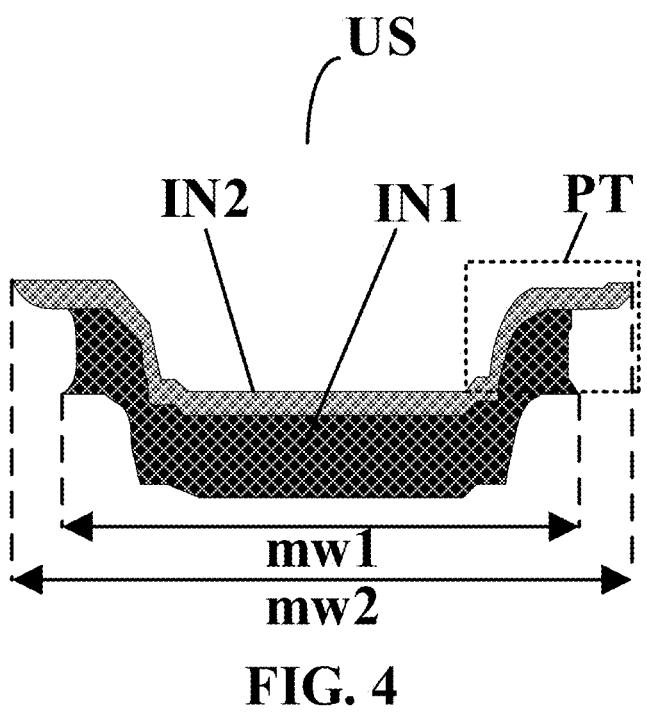
FIG. 4 is a schematic diagram illustrating the structure of an undercut structure in some embodiments according to the present disclosure.

In some embodiments, the pixel definition layer includes an undercut structure. FIG. 4 is a schematic diagram illustrating the structure of an undercut structure in some embodiments according to the present disclosure. Referring to FIG. 2 and FIG. 4, the undercut structure US in some embodiments includes a first insulating layer IN1 on a base substrate BS, and a second insulating layer IN2 on a side of the first insulating layer IN1 away from the base substrate BS. The first insulating layer IN1 is undercut relative to the second insulating layer IN2.

As used herein, the term "undercut" in the context of a structure means that the structure has a first portion and a second portion on the first portion, and that the first portion is more removed on the sides as compared to the second portion. In one example, the term "undercut" means that the first portion is more etched on the sides as compared to the second portion. For example, the first portion and the second portion are stacked along a first direction, and the first portion is more etched on the sides and along a second direction non-parallel (e.g., at an angle greater than 50 degrees, greater than 60 degrees, greater than 70 degrees, greater than 80 degrees, greater than 85 degrees, or 90 degrees) to the first direction. In another example, when an unetched structure is etched to form the undercut structure, side surfaces of a lower portion of the unetched structure are relatively more etched as compared to an upper portion, such that the upper portion has a first area larger than a second area of the lower portion. In another example, the second portion may be used as a mask in the process of etching the first portion.

Referring to FIG. 2 and FIG. 4, a first maximum width mw1 of the first insulating layer IN1 along a direction across two adjacent subpixel regions (e.g., along the A-A' line in FIG. 1) is smaller than a second maximum width mw2 of the second insulating layer IN2 along the direction across two adjacent subpixel regions. An orthographic projection of the second insulating layer IN2 on the base substrate BS covers an orthographic projection of the first insulating layer IN1 on the base substrate BS.

Figure 5:
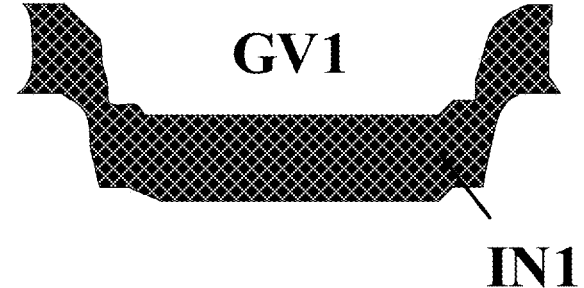
FIG. 5 is a schematic diagram illustrating the structure of a first insulating layer in some embodiments according to the present disclosure.

FIG. 5 is a schematic diagram illustrating the structure of a first insulating layer in some embodiments according to the present disclosure. Referring to FIG. 5, the array substrate in some embodiments includes a first groove GV1 extending in the inter-subpixel region, lateral walls and a bottom of the first groove GV1 are formed by a surface of the first insulating layer IN1. The first groove GV1 is configured to receive at least a portion of the second insulating layer IN2. Referring to FIG. 2, FIG. 4, and FIG. 5, in some embodiments, the first groove GV1 is configured to receive at least a portion of the second insulating layer IN2 and a portion of the organic layer OL. Optionally, the first groove GV1 is a unitary groove extending throughout a first region R1 in the inter-subpixel region ISR, and the first region R1 is a unitary region.

Figure 6:
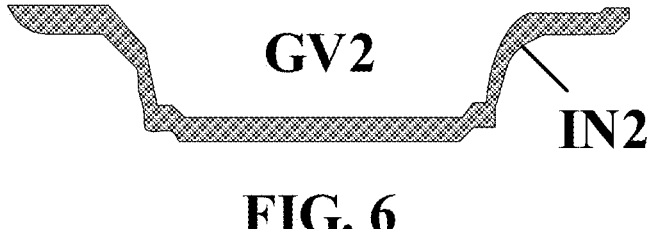
FIG. 6 is a schematic diagram illustrating the structure of a second insulating layer in some embodiments according to the present disclosure.

FIG. 6 is a schematic diagram illustrating the structure of a second insulating layer in some embodiments according to the present disclosure. Referring to FIG. 6, the array substrate in some embodiments includes a second groove GV2 extending in the inter-subpixel region, lateral walls and a bottom of the second groove GV2 are formed by a surface of the second insulating layer IN2. Referring to FIG. 2, FIG. 4, and FIG. 5, in some embodiments, the second groove GV2 is configured to receive a portion of the organic layer OL. Optionally, the second groove GV2 is a unitary groove extending throughout a second region R2 in the inter-subpixel region ISR, and the second region R2 is a unitary region.

In some embodiments, the pixel definition layer PDL includes a plurality of first ring structures 1R respectively in a plurality of first ring regions 1Rr of the inter-subpixel region ISR. The plurality of first ring structures 1R are formed by a plurality of protrusions PT of the undercut structure, a respective protrusion protruding away from the bottom of the second groove GV2, as shown in FIG. 4 and FIG. 6.

As used herein, the term "ring" or "ring structure" may have various appropriate shapes such as a square, rectangle, triangle, doughnut, or another shape. As used herein, a ring structure does not require that the ring shape be unbroken, and the term is intended to encompass structures that are substantially closed, but that comprise a break or a gap in the ring shape. In one example, the ring structure may be a complete ring structure. In another example, the ring structure may be an incomplete ring structure, for example, having a break or gap in the ring shape. In another example, the incomplete ring structure may have a "C" shape or a "U" shape.

Figure 7:
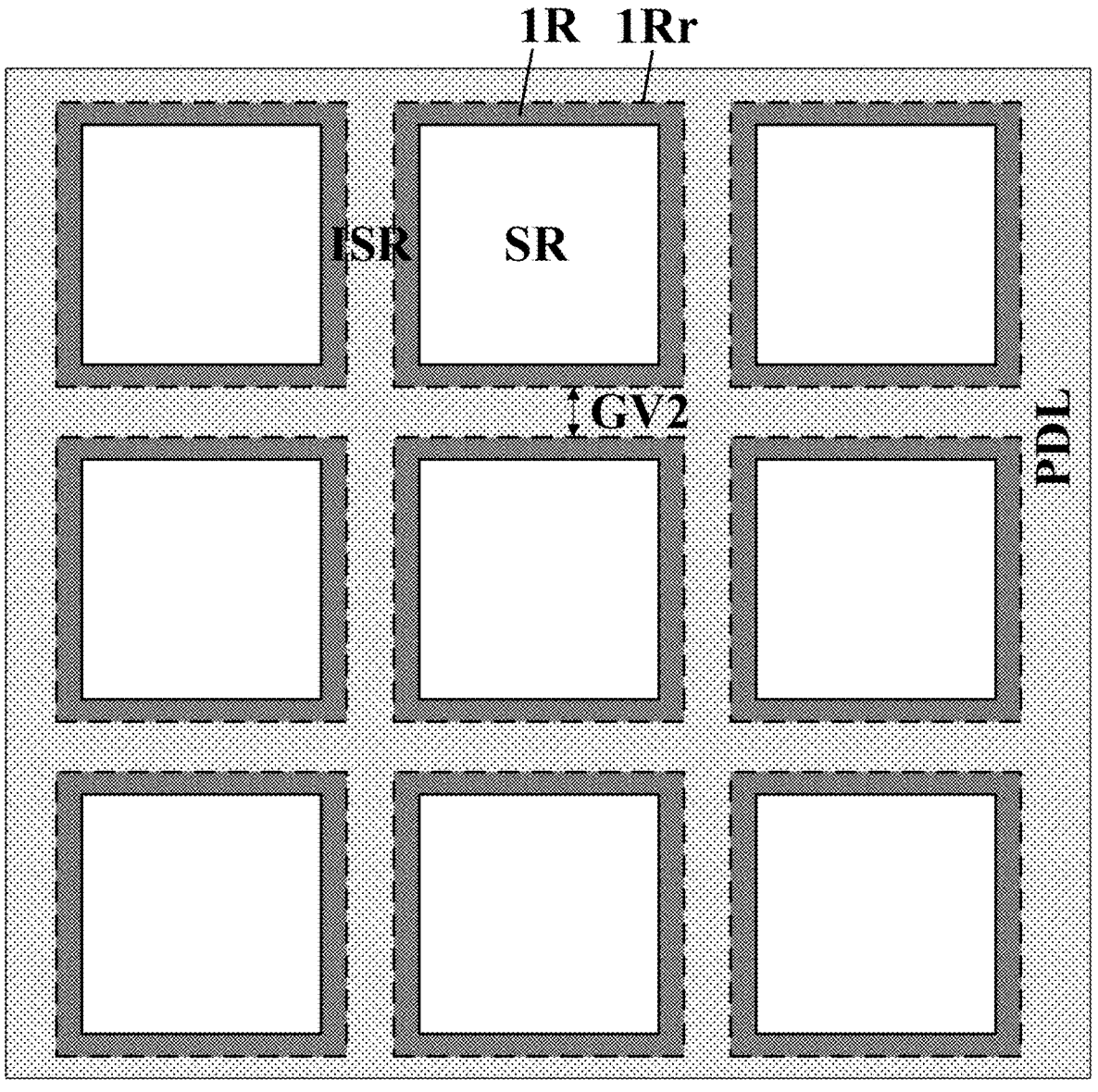
FIG. 7 is a plan view of a pixel definition layer in an array substrate in some embodiments according to the present disclosure.

FIG. 7 is a plan view of a pixel definition layer in an array substrate in some embodiments according to the present disclosure. Referring to FIG. 7, the plurality of first ring structures 1R are spaced apart from each other. A respective first ring structure surrounds the bottom of the second groove GV2. A respective first ring region of the plurality of first ring regions 1Rr surrounds a respective subpixel region of the plurality of subpixel regions SR.

In some embodiments, a respective first ring structure of the plurality of first ring structures 1R protrudes away from the bottom of the second groove GV2, forming a ridge. The ridge formed by the respective first ring structure surrounds the respective subpixel region SR.

Due to the presence of the undercut structure, which has the undercut profile as shown in FIG. 4, when a functional material layer is deposited onto the substrate, the deposited functional material layer are discontinued. Referring to FIG. 2, due to the presence of the undercut structure, the first functional layer FL1 (e.g., a charge generating layer) has a first part P1 at least partially in a first adjacent subpixel region of the plurality of subpixel regions SR, a second part P2 in the inter-subpixel region ISR, and a third part P3 at least partially in a second adjacent subpixel region of the plurality of subpixel regions SR. The first part P1, the second part P2, and the third part P3 of the first functional layer FL1 are at least partially discontinuous parts at least partially segregated due to the presence of the undercut structure.

In some embodiments, the organic layer OL further includes a second functional layer FL2, which is a layer extending across the plurality of subpixel regions SR and the inter-subpixel region ISR. Similarly, the second functional layer FL2 has a fourth part P4 at least partially in a first adjacent subpixel region of the plurality of subpixel regions SR, a fifth part P5 in the inter-subpixel region ISR, and a sixth part P6 at least partially in a second adjacent subpixel region of the plurality of subpixel regions SR. The fourth part P4, the fifth part P5, and the sixth part P6 of the second functional layer FL2 are at least partially discontinuous parts at least partially segregated due to the presence of the undercut structure.

In one example, the second functional layer FL2 includes a red light emitting layer. In another example, the second functional layer FL2 includes a green light emitting layer. In another example, the second functional layer FL2 includes a blue light emitting layer. In one example, the organic layer OL is an organic layer in a tandem OLED structure comprising a charge generating layer, a red light emitting layer, green light emitting layer, and a blue light emitting layer. In another example, the organic layer OL is an organic layer in a tandem OLED structure comprising a charge generating layer, a first blue light emitting layer, a yellow light emitting layer, and a second blue light emitting layer.

In some embodiments, the array substrate further includes a color filter on the encapsulating layer EN. The color filter in some embodiments includes a plurality of color filter blocks in the plurality of subpixel regions SR, respectively. Optionally, the plurality of color filter blocks includes a plurality of color filter blocks of a first color (e.g., a red color), a plurality of color filter blocks of a second color (e.g., a green color), and a plurality of color filter blocks of a third color (e.g., a blue color). A respective color filter block is configured to convert the light emitted from a respective subpixel region into a respective color.

The inventors of the present disclosure discover that, because the functional layers are discontinued in the inter-subpixel region ISR due to the presence of the undercut structure, cross-talk between adjacent subpixels can be eliminated. In particular, when the organic layer OL includes a charge generating layer, it is important to ensure that the charge generating layer is discontinued between adjacent subpixels. By having the undercut structure, the charge generating layer has a first part at least partially in a first adjacent subpixel region of the plurality of subpixel regions SR, a second part in the inter-subpixel region ISR, and a third part at least partially in a second adjacent subpixel region of the plurality of subpixel regions SR.

The first part, the second part, and the third part of the charge generating layer are discontinuous parts segregated at least partially due to the presence of the undercut structure.

In some embodiments, at least a portion of the pixel definition layer PDL includes a stacked structure having multiple layers. Referring to FIG. 2 and FIG. 4, the stacked structure in some embodiments includes a first insulating layer IN1, a second insulating layer IN2 on the first insulating layer IN1, and a portion of the organic layer OL (e.g., the second portion P2 and/or the fifth portion P5) on a side of the second insulating layer IN2 away from the first insulating layer IN1.

Figure 8:
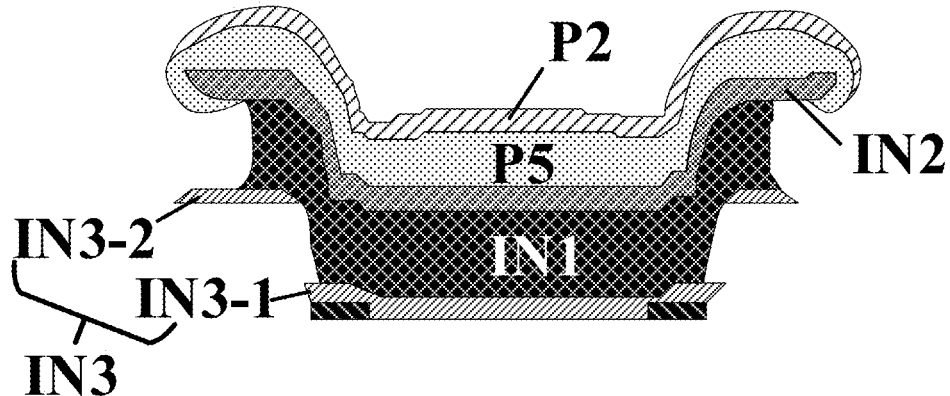
FIG. 8 is a schematic diagram illustrating the structure of a stacked structure in some embodiments according to the present disclosure.

FIG. 8 is a schematic diagram illustrating the structure of a stacked structure in some embodiments according to the present disclosure. Referring to FIG. 8, the stacked structure in some embodiment includes a third insulating layer IN3, a first insulating layer IN1 on the third insulating layer IN3, a second insulating layer IN2 on a side of the first insulating layer IN1 away from the third insulating layer IN3, and a portion of the organic layer OL (e.g., the second portion P2 and/or the fifth portion P5) on a side of the second insulating layer IN2 away from the first insulating layer IN1.

Figure 9:
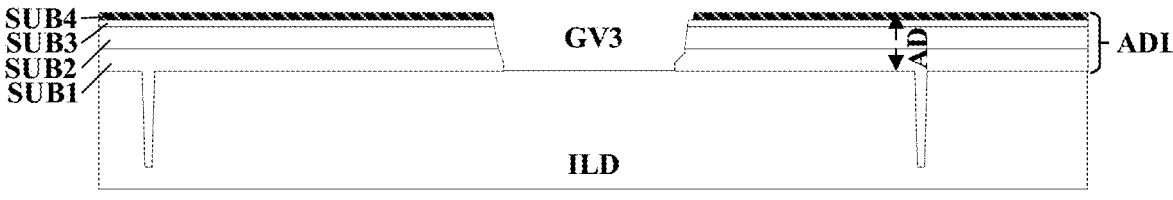
FIG. 9 is a schematic diagram illustrating the structure of an anode layer in some embodiments according to the present disclosure.

FIG. 9 is a schematic diagram illustrating the structure of an anode layer in some embodiments according to the present disclosure. Referring to FIG. 9, the array substrate in some embodiments includes a third groove GV3 extending in the inter-subpixel region, lateral walls of the third groove GV3 are formed by side surfaces of the anode layer ADL, and a bottom of the third groove GV3 is formed by a surface of an underlying structure. In one example, the array substrate is a COMS array substrate comprising a silicon-based driving back plate; and the bottom of the third groove GV3 is formed by a surface of the silicon-based driving back plate. In another example, the bottom of the third groove GV3 is formed by a surface of the inter-layer dielectric layer ILD. The third groove GV3 is configured to receive at least a portion of stacked structure. Referring to FIG. 2, FIG. 8, and FIG. 9, in some embodiments, the third groove GV3 is configured to receive at least a portion of the third insulating layer IN3 and at least a portion of the first insulating layer IN1. Optionally, the third groove GV3 is configured to receive a portion of the second insulating layer IN2. Optionally, the third groove GV3 is a unitary groove extending throughout a third region R3 in the inter-subpixel region ISR, and the third region R3 is a unitary region.

In a process of fabricating the array substrate (as discussed in detail below), the third groove GV3 is formed extending through the anode layer ADL, an insulating material is then deposited to form the third insulating layer IN3. Due to the presence of the third groove GV3, the third insulating layer IN3 is formed to includes a first insulating portion IN3-1 and a second insulating portion IN3-2 separated from each other. Referring to FIG. 2, FIG. 8, and FIG. 9, in some embodiments, the first insulating portion IN3-1 is in contact with the inter-layer dielectric layer ILD, e.g., at the bottom of the third groove GV3; the second insulating portion IN3-2 is not in contact with the inter-layer dielectric layer ILD. In one example, the second insulating portion IN3-2 is on edges of respective anodes of the plurality of anodes AD. In another example, the second insulating portion IN3-2 is in contact with a fourth sublayer SUB4 of the respective anodes of the plurality of anodes AD.

Referring to FIG. 2, by having a unique structure of the third insulating layer IN3, the second insulating portion IN3-2 insulates the respective anodes of the plurality of anodes AD from the organic layer OL on the edges of the respective anodes. The inventors of the present disclosure discover that this structure ensures the subpixels of the array substrate have well-defined subpixel boundary. A synergistic effect can be achieved in displaying a high-resolution image with a combination of the second insulating portion IN3-2 (sharp edges) and the undercut structure (segregation of the organic layer).

In some embodiments, the third insulating layer IN3 includes a plurality of second ring structures 2R respectively in a plurality of second ring regions 2Rr of the inter-subpixel region ISR. The plurality of second ring structures 2R are formed by the second insulating portion IN3-2 of the third insulating layer IN3. A respective second ring structure of the plurality of second ring structures 2R is between a respective anode of the plurality of anodes AD and the organic layer OL.

Figure 10:
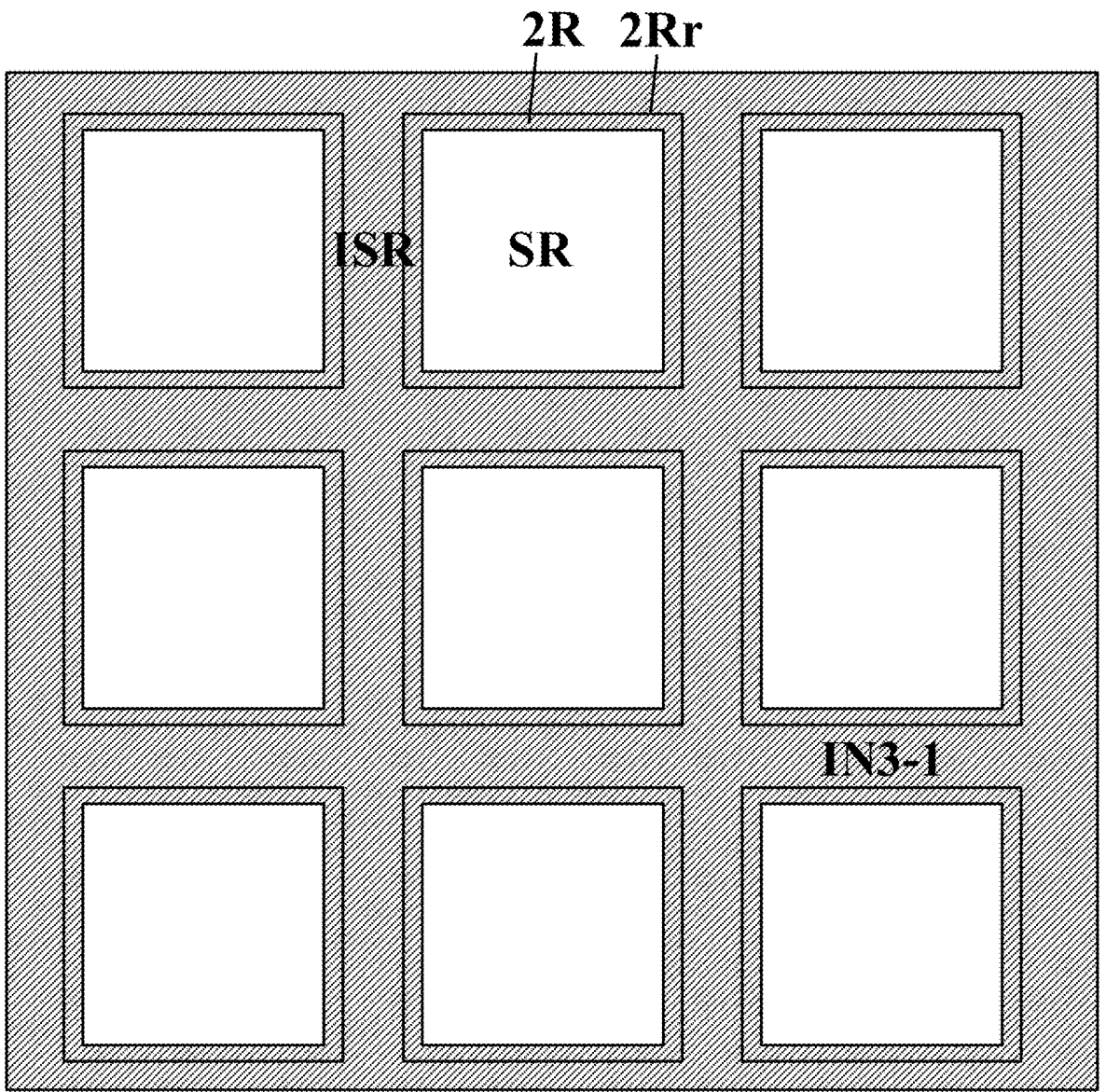
FIG. 10 is a plan view of a third insulating layer in an array substrate in some embodiments according to the present disclosure.

FIG. 10 is a plan view of a third insulating layer in an array substrate in some embodiments according to the present disclosure. Referring to FIG. 10, the plurality of second ring structures 2R are spaced apart from each other. A respective second ring region of the plurality of second ring regions 2Rr surrounds a respective subpixel region of the plurality of subpixel regions SR.

The inventors of the present disclosure discover that the stacked structure in the present array substrate can be made relatively narrow, enhancing aperture ratio of the array substrate. In some embodiments, a width of the stacked structure along a direction across two adjacent subpixel regions (e.g., along the A-A' line in FIG. 1) is in a range of 0.5 µm to 1.5 µm, e.g., 0.5 µm to 0.6 µm, 0.6 µm to 0.7 µm, 0.7 µm to 0.8 µm, 0.8 µm to 0.9 µm, 0.9 µm to 1.0 µm, 1.0 µm to 1.1 µm, 1.1 µm to 1.2 µm, 1.2 µm to 1.3 µm, 1.3 µm to 1.4 µm, or 1.4 µm to 1.5 µm.

Figure 11:
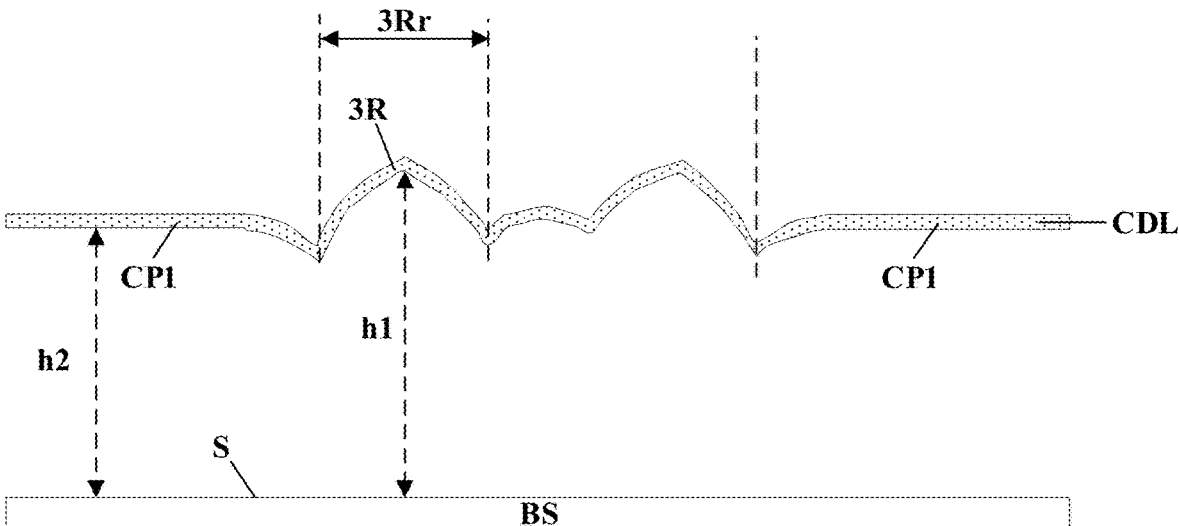
FIG. 11 illustrates the structure of a cathode layer in an array substrate in some embodiments according to the present disclosure.
Figure 12:
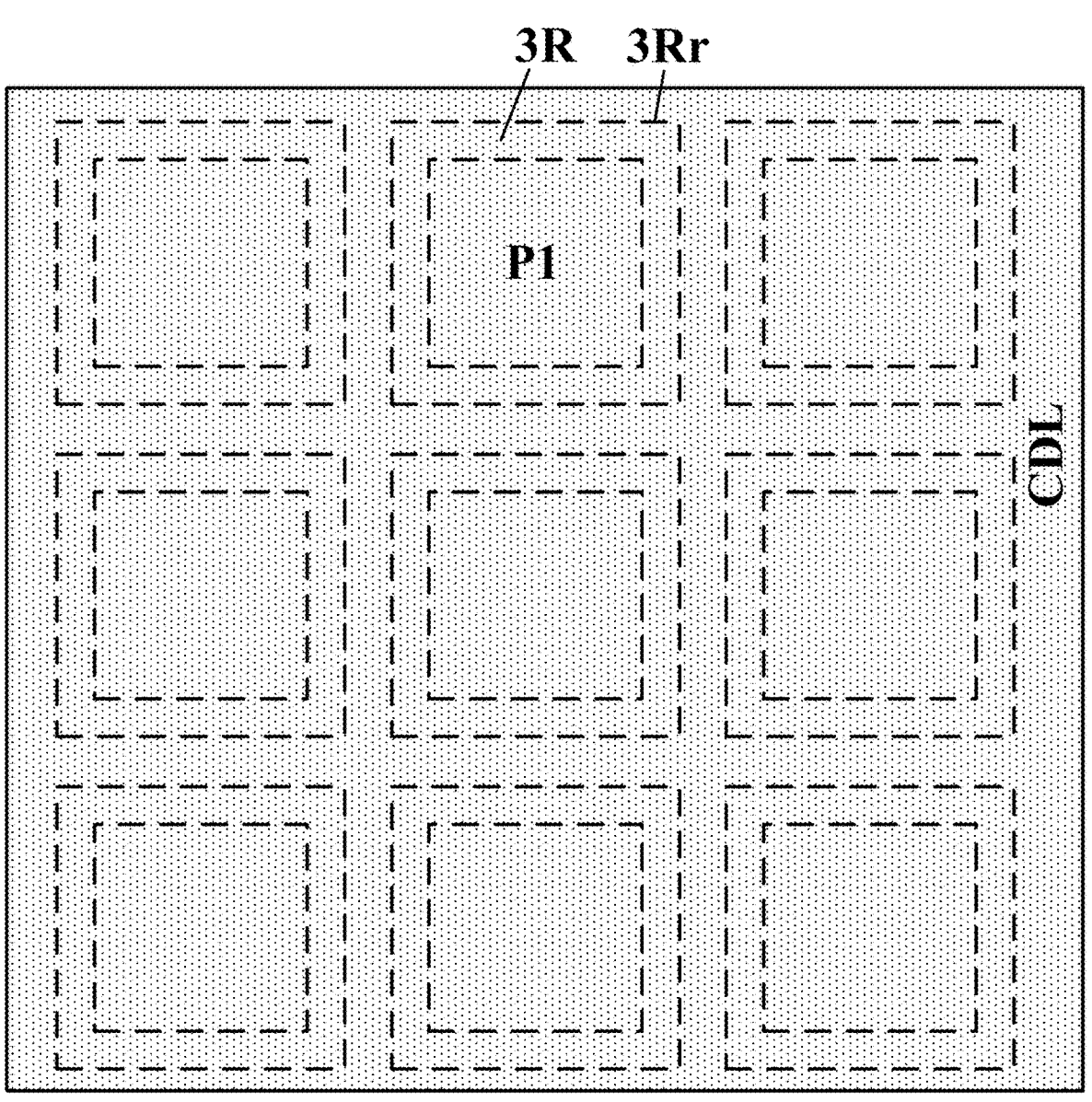
FIG. 12 is a plan view of a cathode layer in an array substrate in some embodiments according to the present disclosure.

FIG. 11 illustrates the structure of a cathode layer in an array substrate in some embodiments according to the present disclosure. FIG. 12 is a plan view of a cathode layer in an array substrate in some embodiments according to the present disclosure. Referring to FIG. 2, FIG. 11 and FIG. 12, the cathode layer CDL in some embodiments includes a plurality of third ring structures 3R respectively in a plurality of third ring regions 3Rr of the inter-subpixel region ISR. Optionally, a respective third ring region of the plurality of third ring regions 3Rr surrounds a respective subpixel region of the plurality of subpixel regions SR. As shown in FIG. 10, the plurality of third ring structures 3R are spaced apart from each other. In some embodiments, the cathode layer CDL further includes a plurality of first cathode portions CP1 in the plurality of subpixel regions SR, respectively. A respective third ring structure surrounds a respective first cathode portion of the plurality of first cathode portions CP1 of the cathode layer CDL.

In some embodiments, a respective third ring structure of the plurality of third ring structures 3R protrudes away from a base substrate BS, forming a ridge. Optionally, the ridge formed by the respective third ring structure surrounds the respective subpixel region SR.

In some embodiments, the plurality of first cathode portions CP1 are spaced apart from each other. The cathode layer CDL extends substantially evenly in a respective first cathode portion of the plurality of first cathode portions CP1, then rises above the respective first cathode portion when it transitions into the respective third ring structure. Optionally, a first height h1 of the respective third ring structure relative to a surface S of the base substrate BS is greater than a second height h2 of a respective first cathode portion of the plurality of first cathode portions CP1 relative to the surface S of the base substrate BS. Optionally, the plurality of third ring structures 3R are portions of the cathode layer CDL having the greatest heights relative to the surface S of the base substrate BS.

FIG. 13 is a schematic diagram illustrating the structure of an organic layer in an array substrate in some embodiments according to the present disclosure. Referring to FIG. 13, the organic layer in some embodiments includes a first hole injection layer HIL1 on the respective anode AD, a first hole transport layer HTL1 on a side of the first hole injection layer HIL1 away from the respective anode AD, a first light emitting layer EML1 (e.g., a red light emitting layer) on a side of the first hole transport layer HTL1 away from the first hole injection layer HIL1, a second light emitting layer EML2 (e.g., a green light emitting layer) on a side of the first light emitting layer EML1 away from the first hole transport layer HTL1, a first electron transport layer ETL1 on a side of the second light emitting layer EML2 away from the first light emitting layer EML1, a charge generating layer CGL on a side of the first electron transport layer ETL1 away from the second light emitting layer EML2, a second hole injection layer HIL2 on a side of the charge generating layer CGL away from the first electron transport layer ETL1, a second hole transport layer HTL2 on a side of the second hole injection layer HIL2 away from the charge generating layer CGL, a third hole transport layer HTL3 on a side of the second hole transport layer HTL2 away from the second hole injection layer HIL2, a third light emitting layer EML3 (e.g., a blue light emitting layer) on a side of the third hole transport layer HTL3 away from the second hole transport layer HTL2, a hole barrier layer HBL on a side of the third light emitting layer EML3 away from the third hole transport layer HTL3, a second electrode transport layer ETL2 on a side of the hole barrier layer HBL away from the third light emitting layer EML3, an electron injection layer EIL on a side of the second electrode transport layer ETL2 away from the hole barrier layer HBL, and a cathode layer CDL on a side of the electron injection layer EIL away from the second electrode transport layer ETL2.

In another aspect, the present disclosure provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a mini light emitting diode display apparatus.

In another aspect, the present disclosure provides a method of fabricating an array substrate. In some embodiments, the method includes forming a pixel definition layer defining a plurality of subpixel regions. Optionally, forming the pixel definition layer includes forming an undercut structure. Optionally, forming the undercut structure includes forming a first insulating layer on a base substrate; and forming a second insulating layer on a side of the first insulating layer away from the base substrate. Optionally, the first insulating layer is undercut relative to the second insulating layer.

Figure 14A:
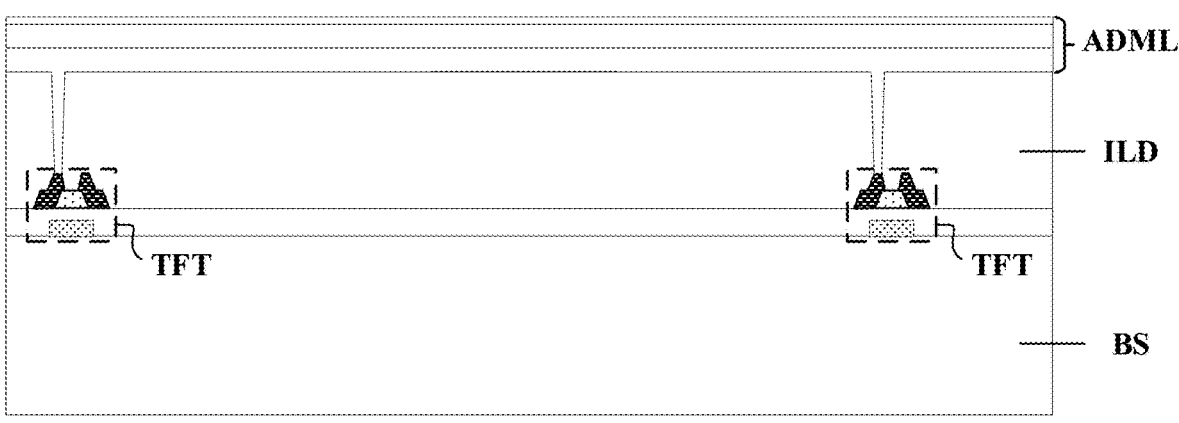
FIG. 14A to FIG. 14G illustrate a process of fabricating an array substrate in some embodiments according to the present disclosure.

FIG. 14A to FIG. 14G illustrate a process of fabricating an array substrate in some embodiments according to the present disclosure. Referring to FIG. 14A, a back plane of an array substrate is provided. The back plane includes a base substrate BS, a plurality of thin film transistors TFT on the base substrate BS, and an inter-layer dielectric layer ILD on a side of the plurality of thin film transistors TFT away from the base substrate BS. The method includes forming an anode material layer ADML on a side of the inter-layer dielectric layer ILD away from the base substrate BS. The anode material layer ADML may have a single layer structure or multi-layer structure. In one example, forming the anode material layer ADML includes forming a first material sublayer made of a metallic material (e.g., titanium) on an inter-layer dielectric layer ILD, forming a second material sublayer made of a metallic material (e.g., aluminum) on a side of the first material sublayer away from the inter-layer dielectric layer ILD, and forming a third material sublayer made of a metallic material (e.g., titanium) on a side of the second material sublayer away from the first material sublayer.

Figure 14B:
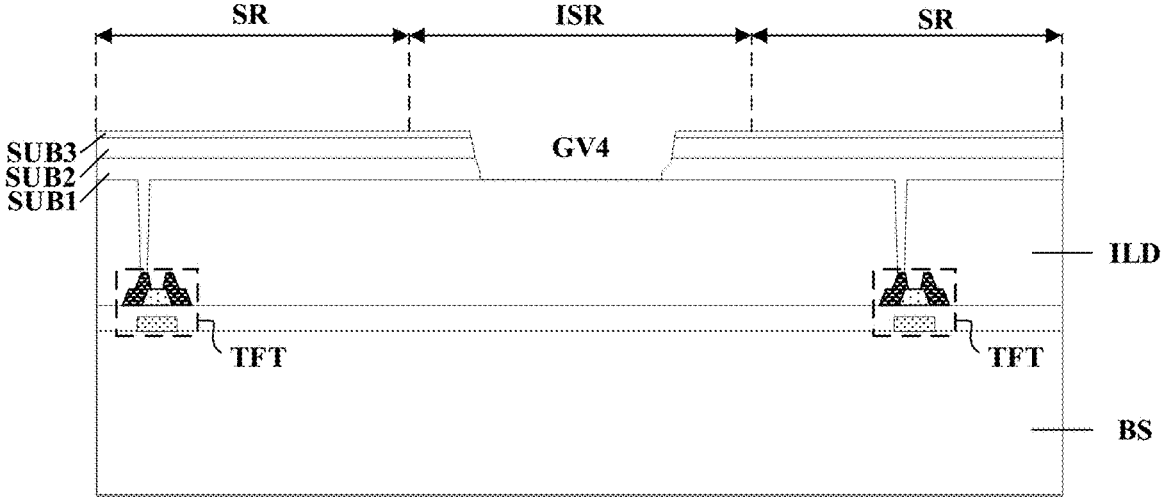

Referring to FIG. 14B, the method in some embodiments further includes patterning the anode material layer to form a fourth groove GV4 extending through the anode material layer to expose a surface of the inter-layer dielectric layer ILD. The fourth groove GV4 is formed in an inter-subpixel region ISR in the array substrate. Subsequent to patterning the anode material layer, in one example, three sublayers of a plurality of anodes AD are formed. The three sublayers include a first sublayer SUB1 on an inter-layer dielectric layer ILD, a second sublayer SUB2 on a side of the first sublayer SUB1 away from the inter-layer dielectric layer ILD, and a third sublayer SUB3 on a side of the second sublayer SUB2 away from the first sublayer SUB1.

Figure 14C:
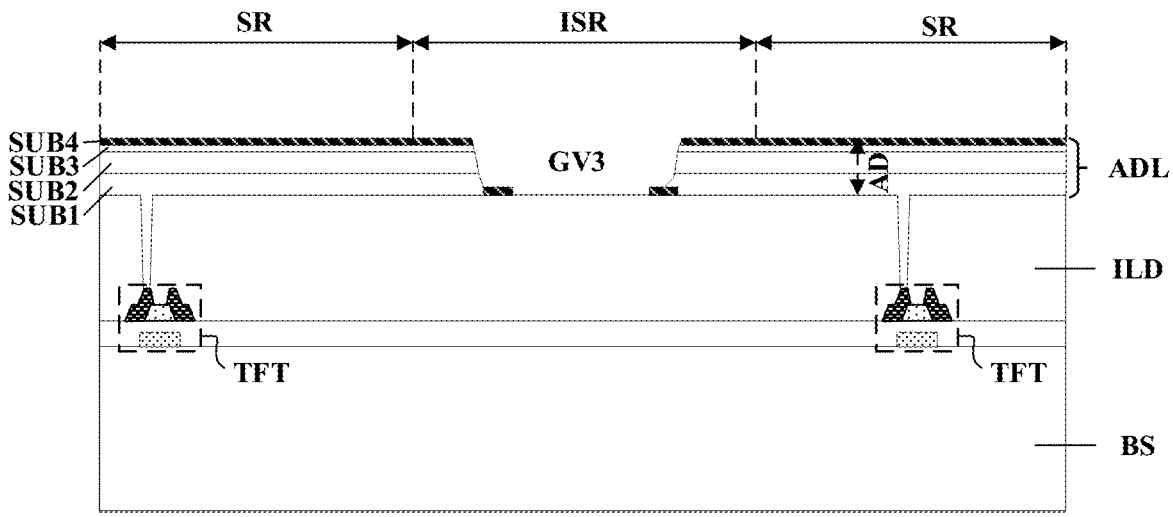

Referring to FIG. 14C, the method in some embodiments further includes forming a fourth sublayer SUB4 of the plurality of anodes AD. In one example, the fourth sublayer SUB4 is made of a metal oxide material (e.g., indium tin oxide). Subsequent to forming the fourth sublayer SUB4, an anode layer ADL is formed. As shown in FIG. 14C, a side surface of the anode layer ADL (e.g., side surface of the first sublayer SUB1, the second sublayer SUB2, the third sublayer SUB3, and the fourth sublayer SUB4) forms lateral walls of a third groove GV3. A surface of the inter-layer dielectric layer ILD forms a bottom of the third groove GV3. The third groove GV3 extends in the inter-subpixel region ISR.

Figure 14D:
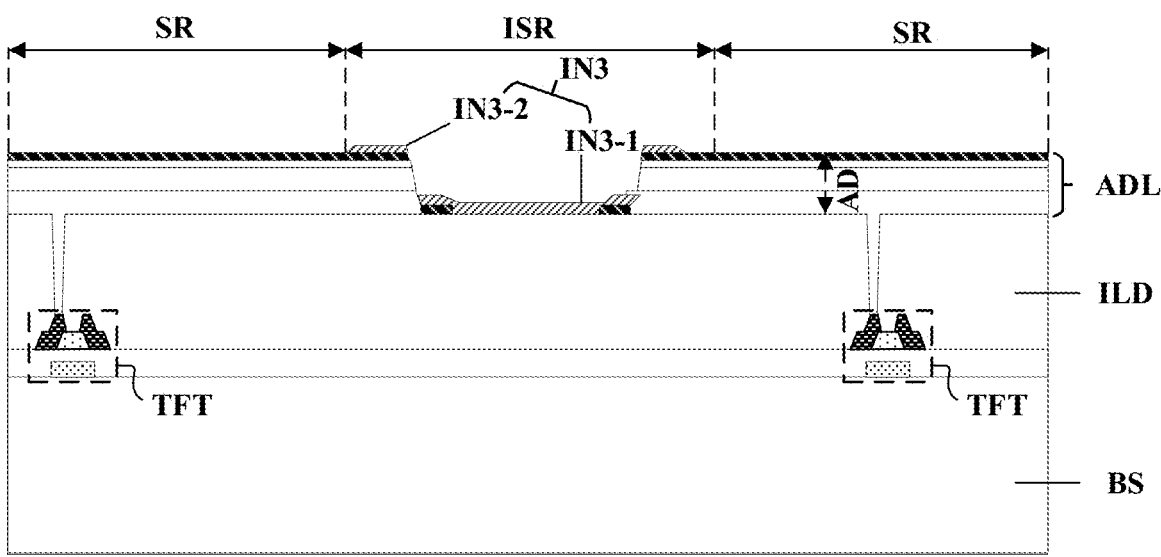

Referring to FIG. 14D, the method in some embodiments further includes forming a third insulating layer IN3. The third groove GV3 is configured to receive at least a portion of the third insulating layer IN3. Due to the presence of the third groove GV3, the third insulating layer IN3 is formed to includes a first insulating portion IN3-1 and a second insulating portion IN3-2 separated from each other. As shown in FIG. 14D, the first insulating portion IN3-1 is in contact with the inter-layer dielectric layer ILD. e.g., at the bottom of the third groove GV3; the second insulating portion IN3-2 is not in contact with the inter-layer dielectric layer ILD. The second insulating portion IN3-2 is on edges of respective anodes of the plurality of anodes AD. The second insulating portion IN3-2 is in contact with a fourth sublayer SUB4 of the respective anodes of the plurality of anodes AD.

Figure 14E:
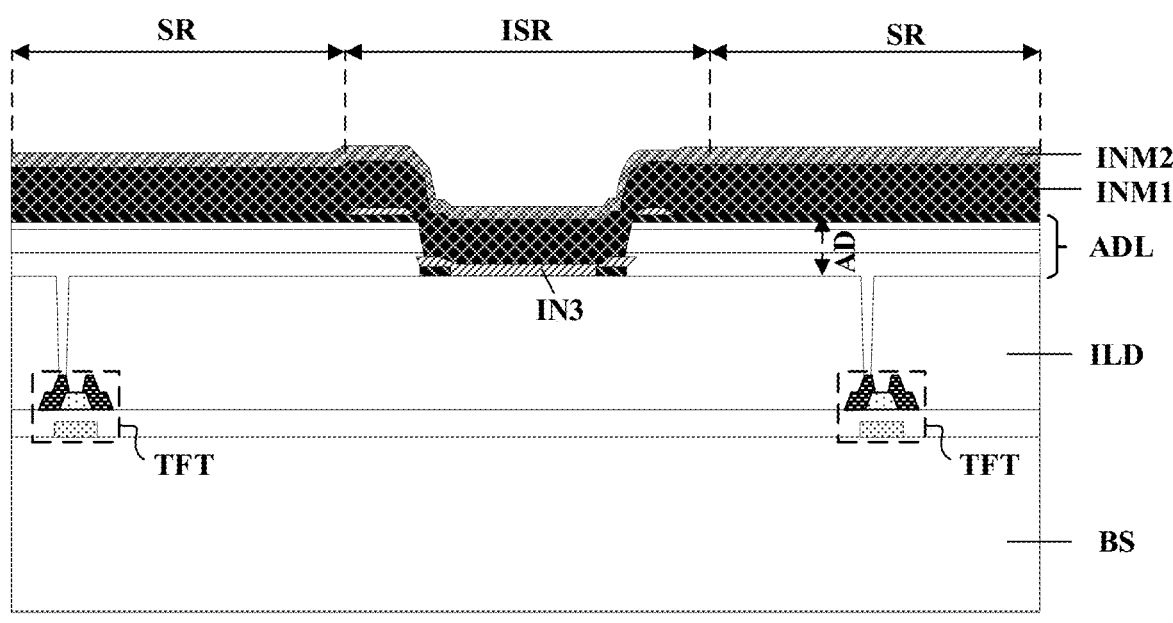

Referring to FIG. 14E, the method in some embodiments further includes forming a first insulating material layer INM1 on a side of the third insulating layer IN3 and the plurality of anodes AD away from the inter-layer dielectric layer ILD, and a second insulating material layer INM2 on a side of the first insulating material layer INM1 away from the third insulating layer IN3 and the plurality of anodes AD.

Figure 14F:
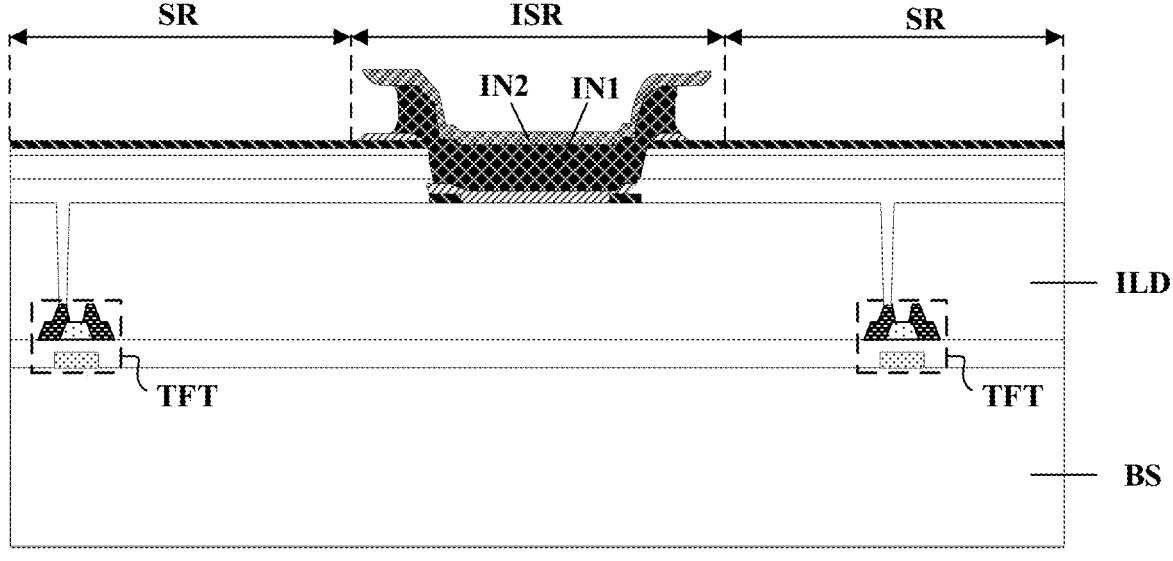

Referring to FIG. 14E and FIG. 14F, the method in some embodiments further includes patterning the first insulating material layer INM1 and the second insulating material layer INM2 to form an undercut structure. The undercut structure includes a first insulating layer IN1 at least partially in the third groove and on the third insulating layer IN3, and a second insulating layer IN2 on a side of the first insulating layer IN1 away from the third insulating layer IN3. The first insulating layer IN1 is undercut relative to the second insulating layer IN2. The first insulating material and the second insulating material layer can be selected so that they have different etching selectivity with respect to an etchant. Specifically, the first insulating material of the first insulating material layer has a first etching selectivity higher than a second etching selectivity for the second insulating material of the second insulating material layer. Optionally, a ratio of the first etching selectivity to the second etching selectivity is in a range of greater than 2:1, e.g., greater than 3:1, greater than 4:1, greater than 5:1, greater than 6:1, greater than 7:1, greater than 8:1, greater than 9:1, greater than 10:1, greater than 20:1, greater than 30:1, greater than 40:1, greater than 50:1, greater than 60:1, greater than 70:1, greater than 80:1, greater than 90:1, or greater than 100:1. As shown in FIG. 14F, when the first insulating material layer INM1 and the second insulating material layer INM2 are etched to form the undercut structure, side surfaces of the first insulating material layer INM1 is relatively more etched as compared to side surfaces of the second insulating material layer INM2, such that the second insulating layer IN2 has a first area larger than a second area of the first insulating layer IN1.

Figure 14G:
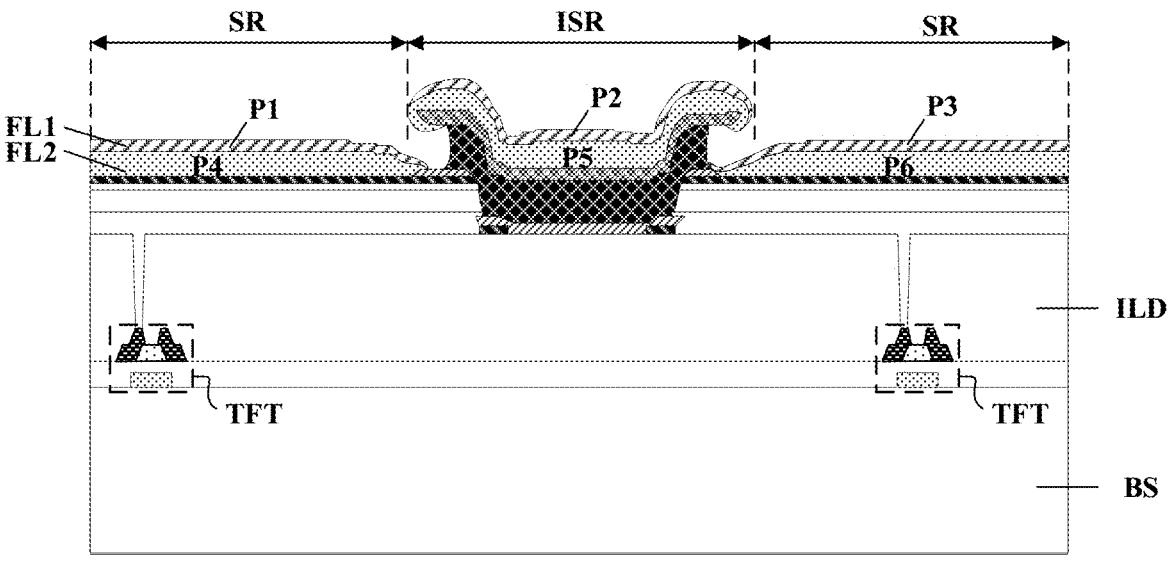

Referring to FIG. 14G, the method in some embodiments further includes depositing layers of an organic layer on the array substrate. In some embodiments, the method includes forming a first functional layer FL1, and forming a second functional layer FL2 on a side of the first functional layer FL1 away from the base substrate BS. Due to the presence of the undercut structure, when the first functional layer FL1 and the second functional layer FL2 are deposited onto the substrate, the deposited functional material layer are discontinued. Referring to FIG. 14G, due to the presence of the undercut structure, the first functional layer FL1 has a first part P1 at least partially in a first adjacent subpixel region of the plurality of subpixel regions SR, a second part P2 in the inter-subpixel region ISR, and a third part P3 at least partially in a second adjacent subpixel region of the plurality of subpixel regions SR. The first part P1, the second part P2, and the third part P3 of the first functional layer FL1 are at least partially discontinuous parts at least partially segregated due to the presence of the undercut structure. Similarly, the second functional layer FL2 has a fourth part P4 at least partially in a first adjacent subpixel region of the plurality of subpixel regions SR, a fifth part P5 in the inter-subpixel region ISR, and a sixth part P6 at least partially in a second adjacent subpixel region of the plurality of subpixel regions SR. The fourth part P4, the fifth part P5, and the sixth part P6 of the second functional layer FL2 are at least partially discontinuous parts at least partially segregated due to the presence of the undercut structure.

Referring to FIG. 2, the method in some embodiments further includes forming additional layers (e.g., a blue light emitting layer) of the organic layer OL on a side of the first functional layer FL1 away from the second functional layer FL2; forming a cathode layer CDL on a side of the organic layer OL away from the base substrate BS, and forming an encapsulating layer EN on a side of the cathode layer CDL away from the organic layer OL.

Various appropriate insulating materials and various appropriate fabricating methods may be used to make the first insulating layer. For example, an insulating material may be deposited on the substrate by a plasma-enhanced chemical vapor deposition process. Examples of materials suitable for making the first insulating layer include, but are not limited to, silicon oxide (SiOy), silicon nitride (SiNy, e.g., $Si_3N_4$), silicon oxynitride (SiO$_x$N$_y$), and a photoresist material.

Various appropriate insulating materials and various appropriate fabricating methods may be used to make the second insulating layer. For example, an insulating material may be deposited on the substrate by a plasma-enhanced chemical vapor deposition process. Examples of materials suitable for making the second insulating layer include, but are not limited to, aluminum oxide.

Various appropriate insulating materials and various appropriate fabricating methods may be used to make the third insulating layer. For example, an insulating material may be deposited on the substrate by a plasma-enhanced chemical vapor deposition process. Examples of materials suitable for making the third insulating layer include, but are not limited to, aluminum oxide.

Various appropriate transparent electrode materials and various appropriate fabricating methods may be used to make the cathode layer. For example, a transparent electrode material may be deposited on the substrate by a plasma-enhanced chemical vapor deposition (PECVD) process. Examples of appropriate transparent electrode materials include, but are not limited to, various transparent metal oxide electrode materials and transparent nano-carbon tubes. Examples of transparent metal oxide materials include, but are not limited to, indium tin oxide, indium zinc oxide, indium gallium oxide, and indium gallium zinc oxide.

Various appropriate insulating materials and various appropriate fabricating methods may be used for making the inter-layer dielectric layer. For example, an insulating material may be deposited on the substrate by a plasma-enhanced chemical vapor deposition process. Examples of materials suitable for making the inter-layer dielectric layer include, but are not limited to, silicon oxide (SiOy), silicon nitride (SiNy, e.g., $Si_3N_4$), silicon oxynitride (SiO$_x$N$_y$), polydimethylsiloxane (PDMS).

Various appropriate materials and various appropriate fabricating methods may be used to make the charge generating layer. Examples of charge generating materials include photogenerating pigments, such as metal phthalocyanines, metal free phthalocyanines, alkylhydroxyl gallium phthalocyanine, hydroxygallium phthalocyanines, perylenes, especially bis(benzimidazo)perylene, titanyl phthalocyanines, and the like, and more specifically, vanadyl phthalocyanines, Type V hydroxygallium phthalocyanines, and inorganic components such as selenium, selenium alloys, and trigonal selenium. The photogenerating pigment can be dispersed in a resin binder such as poly(vinylbutyral), poly(vinylcarbazole), polyesters, polycarbonates, poly(vinylchloride), polyacrylates and methacrylates, copolymers of vinyl chloride and vinyl acetate, phenolic resins, polyurethanes, poly(vinylalcohol), polyacrylonitrile, polystyrene, and the like.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a pixel definition layer defining a plurality of subpixel regions;

wherein the pixel definition layer comprises an undercut structure, the undercut structure comprising a first insulating layer on a base substrate; and a second insulating layer on a side of the first insulating layer away from the base substrate; and the first insulating layer is undercut relative to the second insulating layer;

wherein the array substrate further comprises a first groove extending in an inter-subpixel region, configured to receive at least a portion of the second insulating layer;

wherein lateral walls and a bottom of the first groove are formed by a surface of the first insulating layer.

2. The array substrate of claim 1, wherein an orthographic projection of the second insulating layer on the base substrate covers an orthographic projection of the first insulating layer on the base substrate.

3. The array substrate of claim 2, wherein a first maximum width of the first insulating layer along a direction across two adjacent subpixel is smaller than a second maximum width of the second insulating layer along the direction across two adjacent subpixel regions.

4. An array substrate, comprising a pixel definition layer defining a plurality of subpixel regions;

wherein the pixel definition layer comprises an undercut structure, the undercut structure comprising a first insulating layer on a base substrate; and a second insulating layer on a side of the first insulating layer away from the base substrate; and the first insulating layer is undercut relative to the second insulating layer;

wherein the pixel definition layer comprises a plurality of first ring structures respectively in a plurality of first ring regions of an inter-subpixel region; and the plurality of first ring structures are formed by a plurality of protrusions of the undercut structure.

5. The array substrate of claim 4, comprising a second groove extending in the inter-subpixel region; and wherein lateral walls and a bottom of the second groove are formed by a surface of the second insulating layer.

6. The array substrate of claim 5, wherein a respective protrusion of the plurality of protrusions protrudes away from the bottom of the second groove.

7. The array substrate of claim 4, wherein the plurality of first ring structures are spaced apart from each other; and a respective first ring region of the plurality of first ring regions surrounds a respective subpixel region of the plurality of subpixel regions.

8. An array substrate, comprising a pixel definition layer defining a plurality of subpixel regions;

wherein the pixel definition layer comprises an undercut structure, the undercut structure comprising a first insulating layer on a base substrate; and a second insulating layer on a side of the first insulating layer away from the base substrate; and the first insulating layer is undercut relative to the second insulating layer;

wherein at least a portion of the pixel definition layer comprises a stacked structure; and the stacked structure comprises a third insulating layer, the first insulating layer on the third insulating layer, the second insulating layer on a side of the first insulating layer away from the third insulating layer.

9. The array substrate of claim 8, further comprising an organic layer;

wherein the stacked structure further comprises a portion of the organic layer on a side of the second insulating layer away from the first insulating layer.

10. The array substrate of claim 8, wherein the third insulating layer comprises a first insulating portion and a second insulating portion separated from each other;

the first insulating portion is in contact with an inter-layer dielectric layer; and the second insulating portion is on edges of respective anodes of a plurality of anodes, insulating the respective anodes from an organic layer.

11. The array substrate of claim 8, wherein a width of the stacked structure along a direction across two adjacent subpixel regions is in a range of 0.5 μm to 1.5 μm.

12. The array substrate of claim 1, further comprising a third insulating layer comprising a first insulating portion and a second insulating portion separated from each other;

wherein the third insulating layer comprises a plurality of second ring structures respectively in a plurality of second ring regions of an inter-subpixel region; and the plurality of second ring structures are formed by the second insulating portion.

13. The array substrate of claim 12, wherein the plurality of second ring structures are spaced apart from each other; and a respective second ring region of the plurality of second ring regions surrounds a respective subpixel region of the plurality of subpixel regions.

14. The array substrate of claim 1, further comprising an organic layer, the organic layer comprising a first functional layer extending across the plurality of subpixel regions and an inter-subpixel region;

the first functional layer comprises a first part at least partially in a first adjacent subpixel region of the plurality of subpixel regions, a second part in the inter-subpixel region, and a third part at least partially in a second adjacent subpixel region of the plurality of subpixel regions; and the first part, the second part, and the third part are at least partially discontinuous parts at least partially segregated due to presence of the undercut structure.

15. The array substrate of claim 14, wherein the first functional layer is a charge generating layer.

16. The array substrate of claim 1, further comprising a cathode layer;

wherein the cathode layer comprises a plurality of third ring structures respectively in a plurality of third ring regions of an inter-subpixel region.

17. The array substrate of claim 16, wherein a respective third ring structure of the plurality of third ring structures protrudes away from the base substrate, forming a ridge; and the ridge formed by the respective third ring structure substantially surrounds a respective subpixel region of the plurality of subpixel regions.

18. The array substrate of claim 16, wherein the cathode layer is a unitary layer and further comprises a plurality of first cathode portions in the plurality of subpixel regions, respectively; and the cathode layer rises above a respective first cathode portion of the plurality of first cathode portions when it transitions into a respective third ring structure.

19. A display apparatus, comprising the array substrate of claim 1, and an integrated circuit connected to the array substrate.

* * * * *